(12) United States Patent
Lee

(10) Patent No.: US 7,316,953 B2
(45) Date of Patent: Jan. 8, 2008

(54) METHOD FOR FORMING A RECESSED GATE WITH WORD LINES

(75) Inventor: Pei-Ing Lee, Changhua County (TW)

(73) Assignee: Nanya Technology Corporation, Taoyuan (TW)

( * ) Notice: Subject to any disclaimer, the term of this patent is extended or adjusted under 35 U.S.C. 154(b) by 338 days.

(21) Appl. No.: 11/145,728

(22) Filed: Jun. 6, 2005

(65) Prior Publication Data

US 2006/0270151 A1    Nov. 30, 2006

Related U.S. Application Data

(63) Continuation-in-part of application No. 11/141,656, filed on May 31, 2005.

(51) Int. Cl.
*H01L 21/8242* (2006.01)

(52) U.S. Cl. ............ 438/243; 438/270; 438/589; 257/E21.652

(58) Field of Classification Search ......... 257/E21.652
See application file for complete search history.

(56) References Cited

U.S. PATENT DOCUMENTS

| 6,331,459 | B1 | 12/2001 | Gruening |
| 6,707,095 | B1 | 3/2004 | Chidambarrao et al. |
| 7,015,092 | B2 | 3/2006 | Jaiprakash et al. |
| 7,164,170 | B2 * | 1/2007 | Kim ........................... 257/330 |
| 2002/0105019 | A1 * | 8/2002 | Mandelman et al. ....... 257/296 |
| 2004/0036100 | A1 | 2/2004 | Divakaruni et al. |
| 2004/0238869 | A1 | 12/2004 | Chang et al. |
| 2005/0054157 | A1 | 3/2005 | Hsu |
| 2005/0067648 | A1 | 3/2005 | Hung et al. |
| 2006/0228861 | A1 | 10/2006 | Kang et al. |
| 2006/0258109 | A1 * | 11/2006 | Juengling ................... 438/301 |
| 2006/0270176 | A1 | 11/2006 | Lee et al. |

* cited by examiner

*Primary Examiner*—Stephen W. Smoot
(74) *Attorney, Agent, or Firm*—Quintero Law Office

(57) ABSTRACT

A method for forming a semiconductor device. A substrate is provided, wherein the substrate has recessed gates and deep trench capacitor devices therein. Protrusions of the recessed gates and upper portions of the deep trench capacitor devices are revealed. Spacers are formed on sidewalls of the upper portions and the protrusions. Buried portions of conductive material are formed in spaces between the spacers. The substrate, the spacers and the buried portions are patterned to form parallel shallow trenches for defining active regions. A layer of dielectric material is formed in the shallow trenches, wherein some of the buried portions serve as buried bit line contacts. Word lines are formed across the recessed gates, wherein at least one of the word lines comprises portions overlapping the recessed gates. At least one of the overlapped portions has a narrower width than at least one of the recessed gates.

32 Claims, 8 Drawing Sheets

METHOD FOR FORMING A RECESSED GATE WITH WORD LINES

BACKGROUND

This application is a continuation in part of, NTC 94042, application Ser. No. 11/141,656, filed May 31, 2005, entitled "method for forming a semiconductor device."

The present invention relates in general to a method for forming a semiconductor device, and more particularly to a method for forming word lines of a semiconductor device.

Semiconductor devices, such as memory devices, Dynamic Random Access Memory (DRAM) for storage of information, or others, are currently in widespread use, in a myriad of applications.

The conventional method of forming transistor and bit line contact, however, requires at least two photolithography processes resulting in higher fabrication costs relative to a mask or reticle. Serious misalignment among the four photolithography processes, consisting of the capacitor, active area, transistor, and bit line contact, also occurs to affecting fabrication field. The determined width of the word line occupies the space for the bit line contact. Thus, shorts between bit line contact and word line are easily inducted causing contact fail. Particularly, the failures may become increasingly serious with shrinkage of DRAM dimensions. Accordingly, a new method for forming word and bit line contacts of a memory device is desirable.

SUMMARY

A method for forming a semiconductor device is provided. An exemplary embodiment of a method for forming a semiconductor device comprises providing a substrate having recessed gates and deep trench capacitor devices therein. Protrusions of the recessed gates and upper portions of the deep trench capacitor devices are revealed. Spacers are formed on sidewalls of the upper portions and the protrusions. Buried portions of conductive material are formed in spaces between the spacers. The substrate, the spacers and the buried portions are patterned to form parallel shallow trenches for defining active regions. A layer of dielectric material is formed in the shallow trenches, wherein some of the buried portions serve as buried bit line contacts. Word lines are formed across the recessed gates, wherein at least one of the word lines comprises portions overlapping the recessed gates. At least one of the overlapped portions has a narrower width than at least one of the recessed gates.

DESCRIPTION OF THE DRAWINGS

The invention can be more fully understood by reading the subsequent detailed description and examples with reference made to the accompanying drawings, wherein.

DETAILED DESCRIPTION OF THE INVENTION

Figure 1:
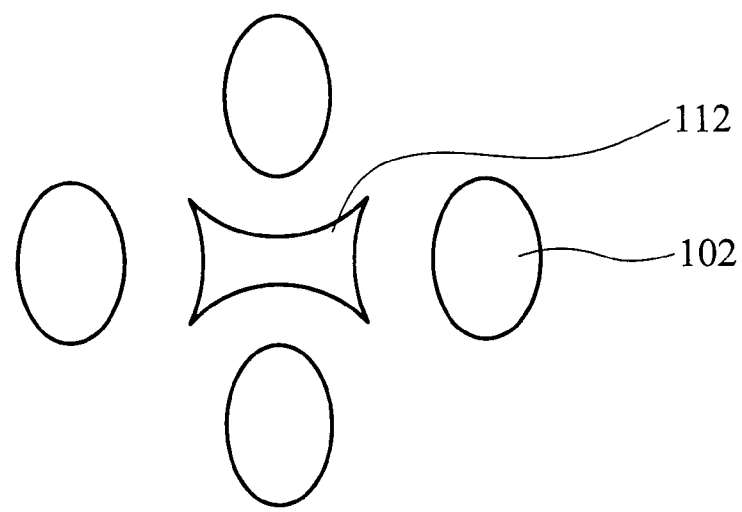
FIG. 1 is a top view illustrating an arrangement of deep trench capacitor devices and recessed gates of an embodiment of the invention.

The invention, which provides a method for forming a semiconductor device, will be described in greater detail by referring to the drawings that accompany the invention. It is noted that in the accompanying drawings, like and/or corresponding elements are referred to by like reference numerals. The following description discloses the best-contemplated mode of carrying out the invention. This description is made for the purpose of illustrating the general principles of the invention and should not be taken in a limiting sense. The scope of the invention is best determined by reference to the appended claims.

In this specification, expressions such as "overlying the substrate", "above the layer", or "on the film" simply denote a relative positional relationship with respect to the surface of a base layer, regardless of the existence of intermediate layers. Accordingly, these expressions indicate not only the direct contact of layers, but also, a non-contact state of one or more laminated layers.

FIG. 1 shows the top view of disposal of deep trench capacitor devices 102 and recessed transistors 112, wherein the profiles of recessed transistors are determined by surrounding deep trench capacitor devices and the spacers on the side walls of upper portions of deep trench capacitor devices.

Figure 2:
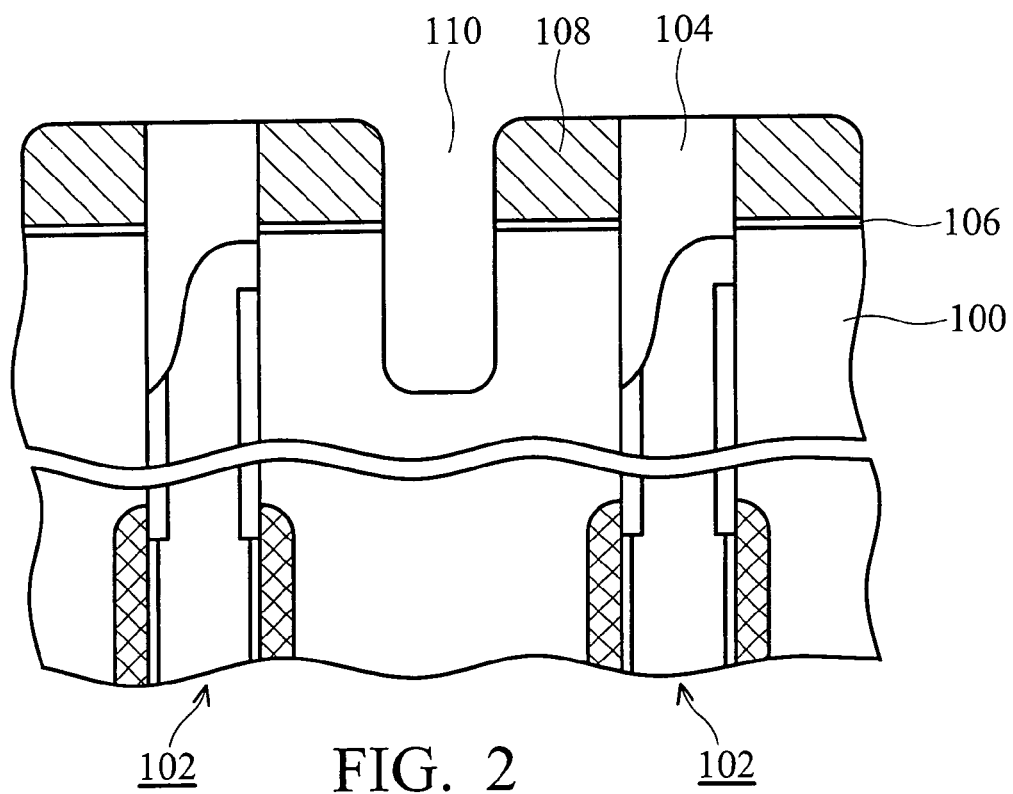
FIG. 2 is cross section view illustrating the method for forming recessed trenches of an embodiment of the invention.

Referring to FIG. 2, a substrate 100 is provided. The substrate 100 has deep trench capacitor devices 102 therein, and the upper portions 104 of the deep trench capacitor devices 102 are above the surface of the substrate 100. A pad layer 106 and a dielectric cap layer, such as nitride (SiN) 108 are formed on the sidewalls of the upper portions 104 of the deep trench capacitor devices 102. The profile of the dielectric cap layer 108 has a concave area which is substantially at the middle of two upper portions 104 of the nearby deep trench capacitors. Thus, the dielectric layer cap 108, the pad layer 106, and the substrate 100 are self-aligned and etched to form a recess trench 110 between the trench capacitor devices 102.

Figure 3:
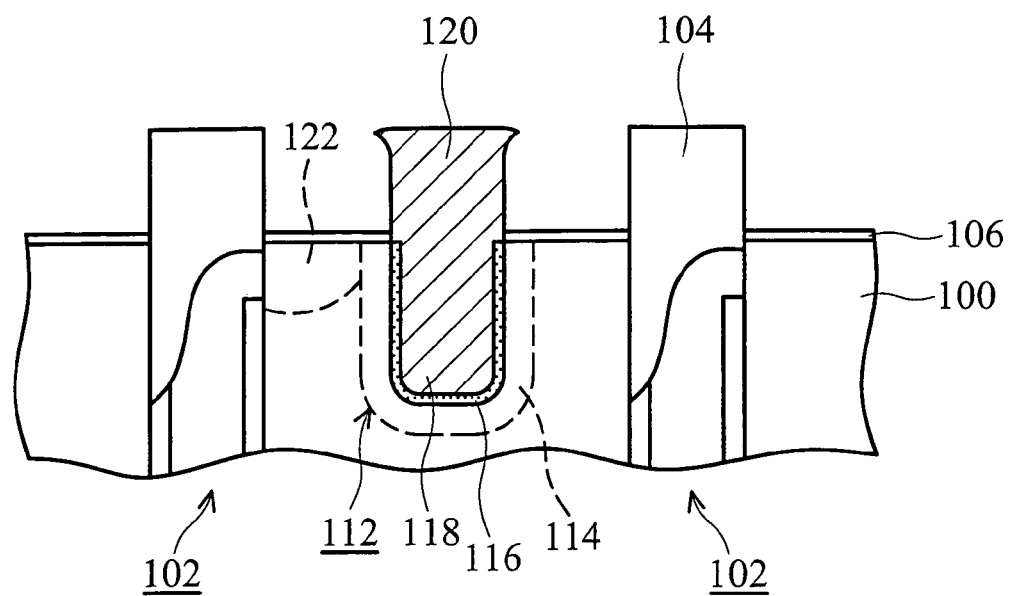
FIG. 3 is cross section view illustrating the method for forming recessed transistors with protrusions of an embodiment of the invention.

Referring to FIG. 3, the substrate 100 adjacent the recessed trench 110 is doped to form channel area 114 surrounding the recessed trench 110. Then, a gate dielectric layer 116, preferably comprising silicon oxide, is formed in the recessed trench 110 on the substrate 100. The gate dielectric layer 116 can be formed using a thermal process for example. A conductive material, such as polysilicon, tungsten or tungsten silicide, is filled in the recessed trench 110 to form a recessed gate electrode 118. An out diffusion region 122 is formed during the thermal process of forming the gate dielectric 116 and/or the other thermal process in following processes.

The upper portions 104 of deep trench capacitor devices 102, the dielectric cap layer 108, and the upper surfaces of the recessed gate electrodes 118 are planarized, and the dielectric cap layer 108 is then stripped by selective wet etching to reveal the upper portions 104 of deep trench capacitor devices 102 and the protrusions 120 of the recessed gate electrodes 118. The planarizing method may comprise a chemical mechanical polishing (CMP) process, a blanket etching back process or a recess etching process. The upper surfaces of the protrusions 120 of the recessed gate electrodes 118 are substantially the same level as the upper portions 104 of the deep trench capacitor devices 102.

Figure 4:
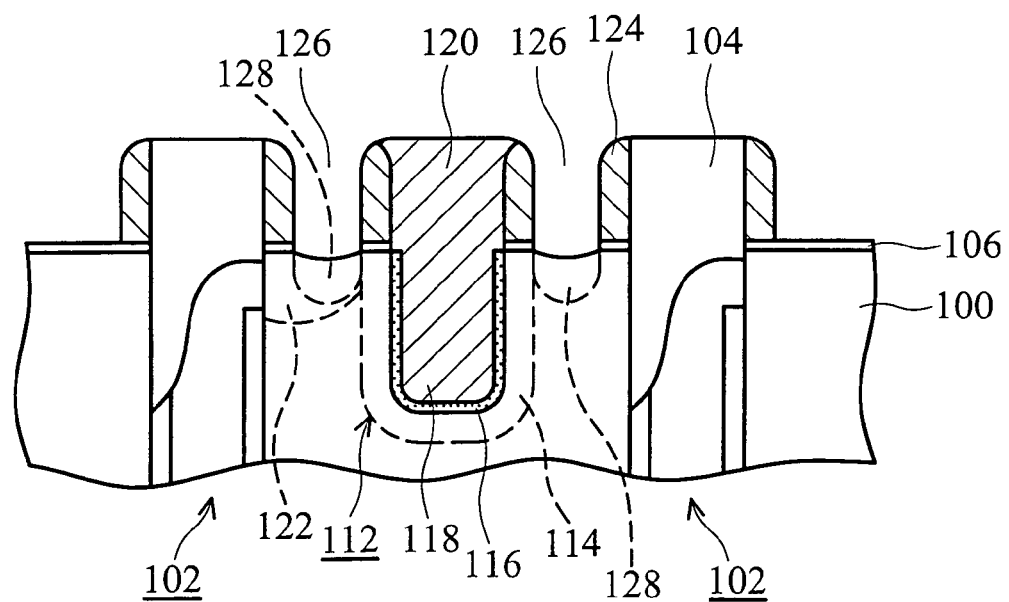
FIG. 4 is cross section view illustrating the method for forming spaces by spacers of an embodiment of the invention.

Referring to FIG. 4, spacers 124 are formed on sidewalls of the upper portions 104 and the protrusions 120 such that spaces 126 between the spacers 124 thereon are self-aligned. The spacers 124 can be formed by deposition and dry etching back of a CVD silicon nitride film. Therefore, the spacers 124 enclose the upper portions 104 and the protrusions 120. And the substrate 100 is covered by the deep trench capacitor devices 102, the recessed transistor 112 and the spacers 124 beyond the circular spaces 126. Thereafter, ion implantation is executed to form source/drain regions 128 on opposite sides of the recessed channel area 114 and under the spaces 126.

Figure 5:
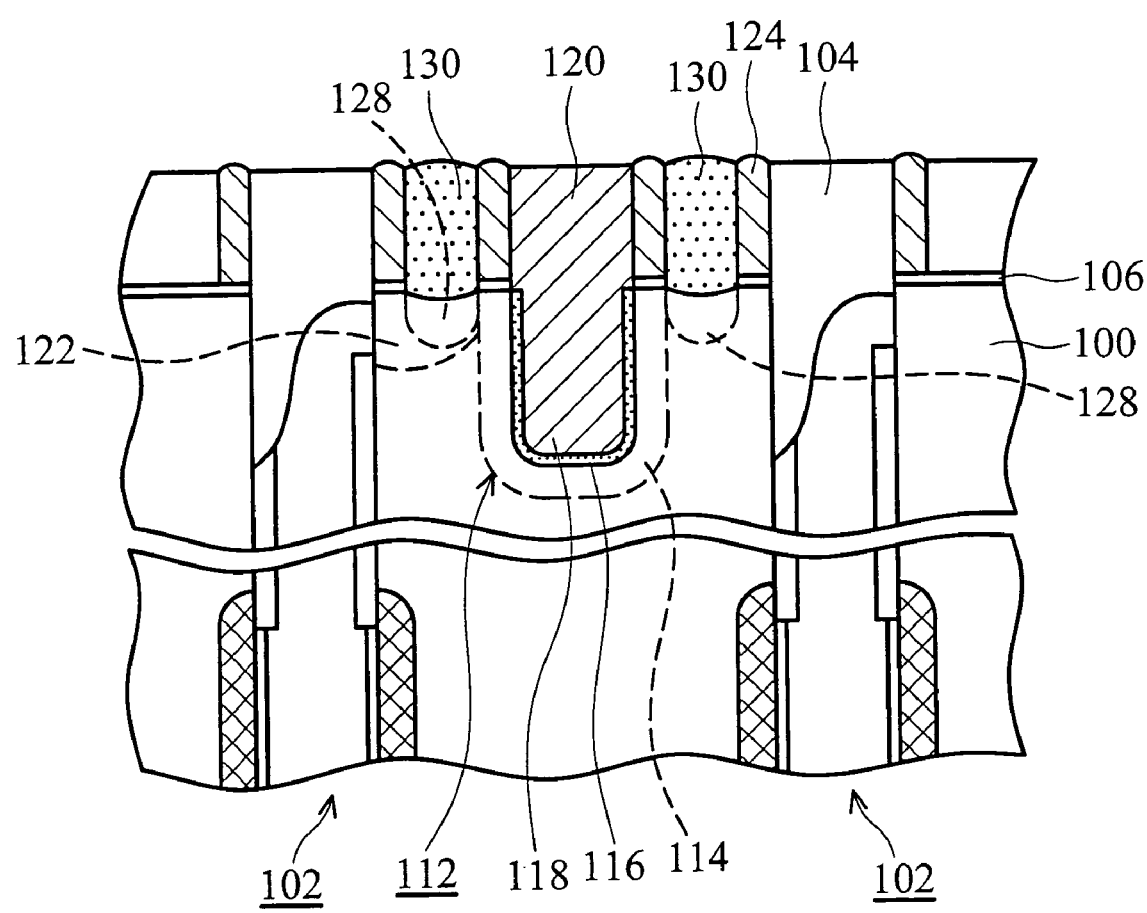
FIG. 5 is cross section view illustrating the method for forming buried portions of an embodiment of the invention.
Figure 6:
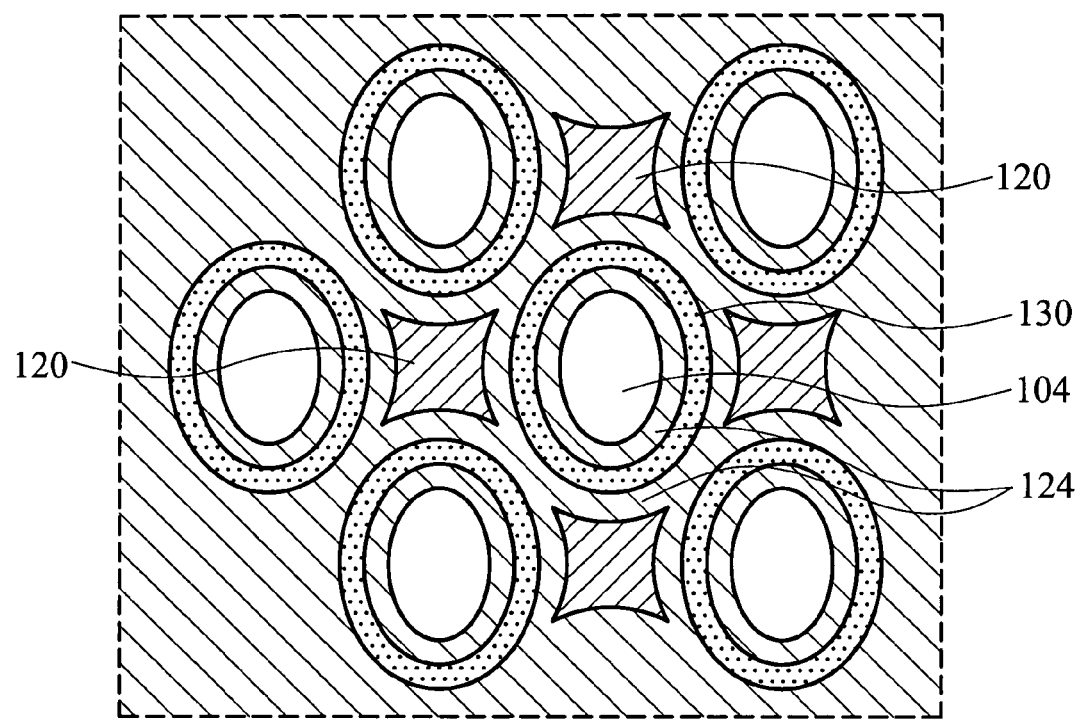
FIG. 6 is a top view illustrating the arrangement of deep trench capacitor devices, recessed gates, spacers, and buried portions of an embodiment of the invention.

Referring to FIG. 5 and FIG. 6, a layer of conductive material, preferably comprising doped poly or metal, is formed over the substrate 100 and filled the spaces 126 between the spacers 124. Then, the layer of conductive material, the spacers 124, the deep trench capacitor devices 102 and the recessed gates 112 are planarized to form buried portions 130 in the spaces 126 between the spacers 124. The buried portions 130 surround the upper portions 104 of the deep trench capacitor devices 102, as shown in the FIG. 5 and FIG. 6. The planarizing process, can be accomplished by a chemical mechanical polish (CMP) process, a blanket etching back process or a recess etching process.

FIG. 6 shows a top view of the patterns of upper portions 104 of deep trench capacitor devices 102, the spacers 124, the buried portions 130, and the protrusions 120 of recessed transistors 112 after planarizing.

Figure 7:
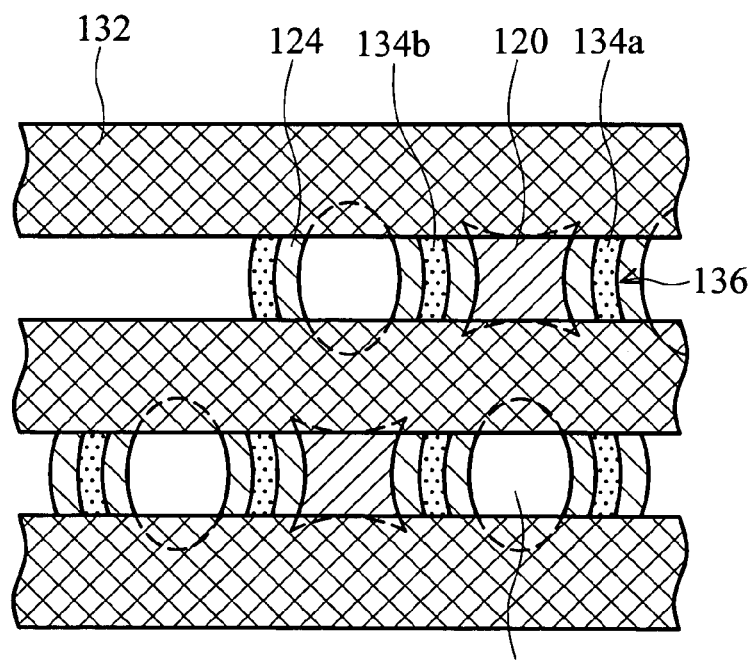
FIG. 7 is a top view illustrating the arrangement of shallow trenches, patterned deep trench capacitor devices, patterned recessed gates, patterned spacers, and patterned buried portions of an embodiment of the invention.

Referring to FIG. 6 and FIG. 7, the spacers 124, the buried portions 130, the deep trench capacitor devices 102 and the recessed gates 112 are patterned to form parallel shallow trenches 132. The patterning process can be accomplished by using of a photolithography process and an etching process. Patterning process simultaneously defines active regions 136 and creates isolation to isolate the transistors. The parallel shallow trenches 132 are adjacent to patterned edges of the deep trench capacitor devices 102 and the recessed gates 112. In other words, the remaining spacers 124 and the remaining buried portions 130 are separated into several regions at the sides of the deep trench capacitors 102 and the recessed gates 112. Therefore, patterned buried portions 134a and 134b are formed, and the patterned buried portions 134a serve as buried contacts or buried bit line contacts 134a.

A layer of dielectric material is then formed in the shallow trenches. The dielectric material can be oxide deposited by high density plasma (HDP) process to form shallow trench isolations in the related art. Consequently, the dielectric material is planarized to expose the upper portions 104, the spacers 124, the patterned buried portions 134a and 134b, and the protrusions 120.

Figure 8:
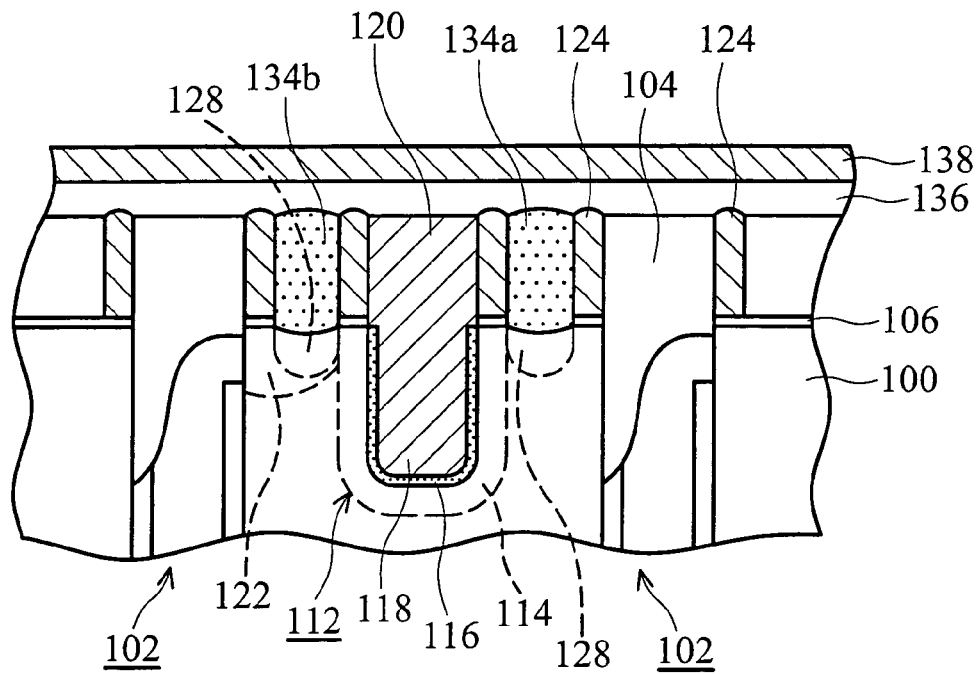
FIG. 8 is cross section view illustrating the method for forming word lines of an embodiment the invention.

Referring to FIG. 8, a layer of conductive material 136 is deposited over the entire substrate 100. The conductive material is preferably selected from a simplified pure metal silicide, for example tungsten silicide (WSi), or metal, for example tungsten (W). Preferably, the thickness of the conductive material layer 136 is about 800 Å to 1500 Å. The conductive material layer 136 is blanketly deposited. A layer of dielectric material 138 is then deposited over the conductive material 136. The dielectric material 138 is preferably selected from SiN formed by a CVD process. Preferably, the thickness of the dielectric material layer 138 is about 800 Å to 1500 Å. The dielectric material layer 138 will serve as an etching stop layer for a self-aligned upper bit line contact hole formed in following process.

Thus, the invention is advantageous in that, a pure metal or pure metal silicide is directly deposited on top of the recess gates 120. No blanket poly layer is needed. In addition, a pure metal or pure metal silicide is used as gate conductor. Overall gate conductor thickness can be reduced, since there is no poly layer. The reduction of gate conductor thickness makes the subsequent SAC bit line contact holes etching process much easier to perform, and also reduces the bit line and word line coupling.

Figure 9:
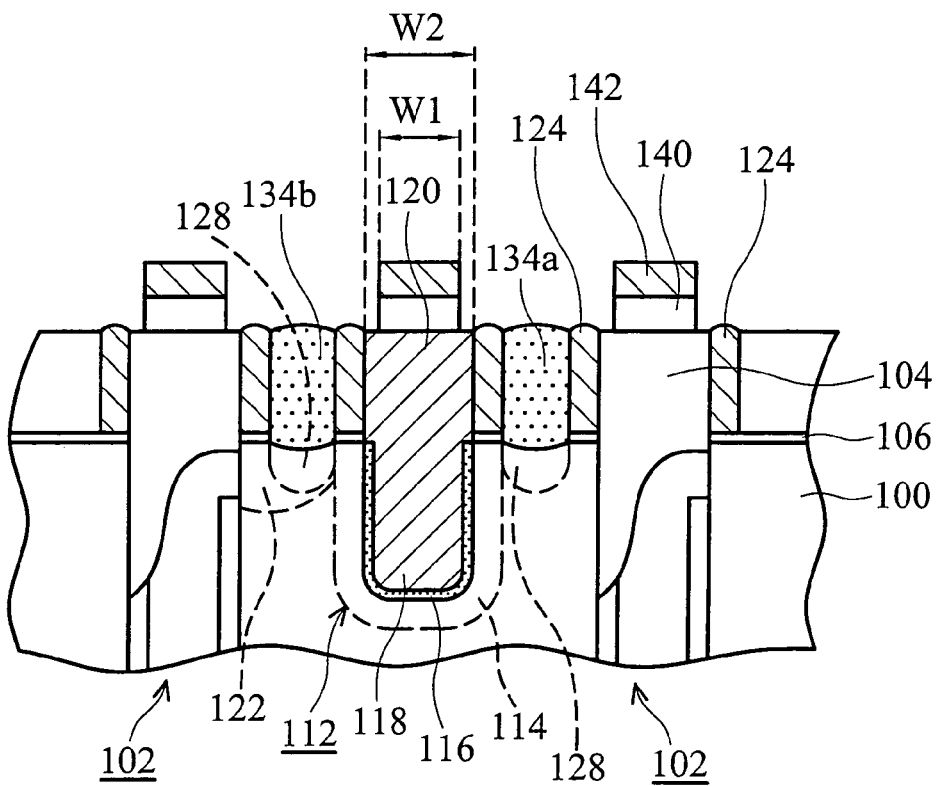
FIG. 9 is cross section illustrating the method for forming word lines of an embodiment of the invention.

Referring to FIG. 9, the dielectric material layer 138 and the conductive material layer 136 are patterned by using of a photolithography process and an etching process to form word lines 140 and gate cap dielectrics 142. The word lines 140 are formed across some of the deep trench capacitor devices 102 and/or across some of the recessed gates 112.

At least one of the word lines comprises portions overlapping the recessed gates 120. At least one of the overlapped portions has a narrower width W1 than the width W2 of at least one of the recessed gates 120.

In some embodiments of the invention, the word lines are disposed in parallel. The width of the word lines is narrower than that of the recessed gates 112.

Figure 14:
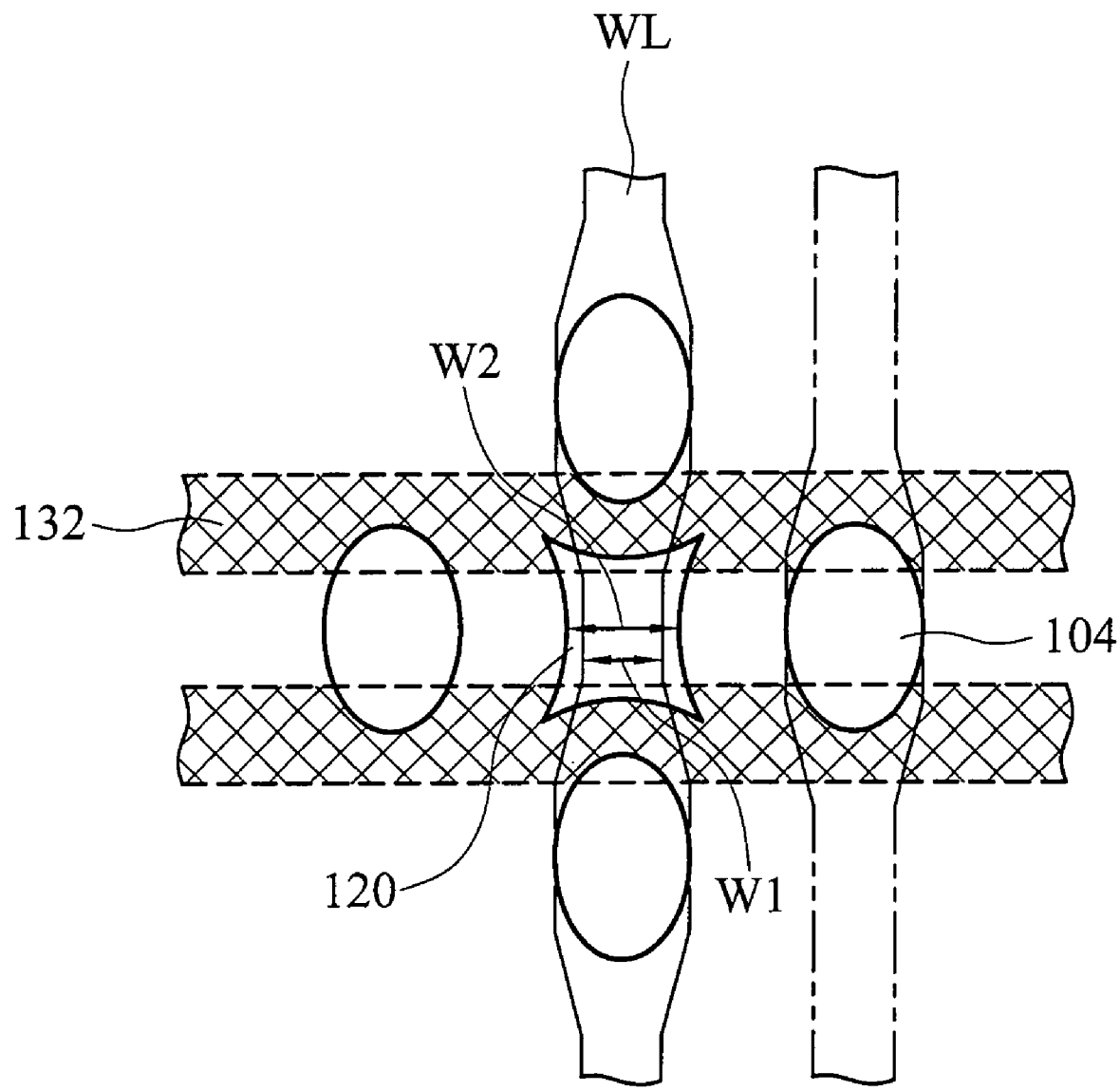
FIG. 14 is a top view illustrating the arrangement of shallow trenches, patterned deep trench capacitor devices, patterned recessed gates, and word lines of an embodiment of the invention.

Referring to FIG. 14, in some embodiments of the invention, at least one of the word lines has several portions with different widths. At least one of the portions overlapping a recessed gate 112 and the overlapped portion has a narrower width W1 than the width W2 of the recessed gate 112.

Figure 10:
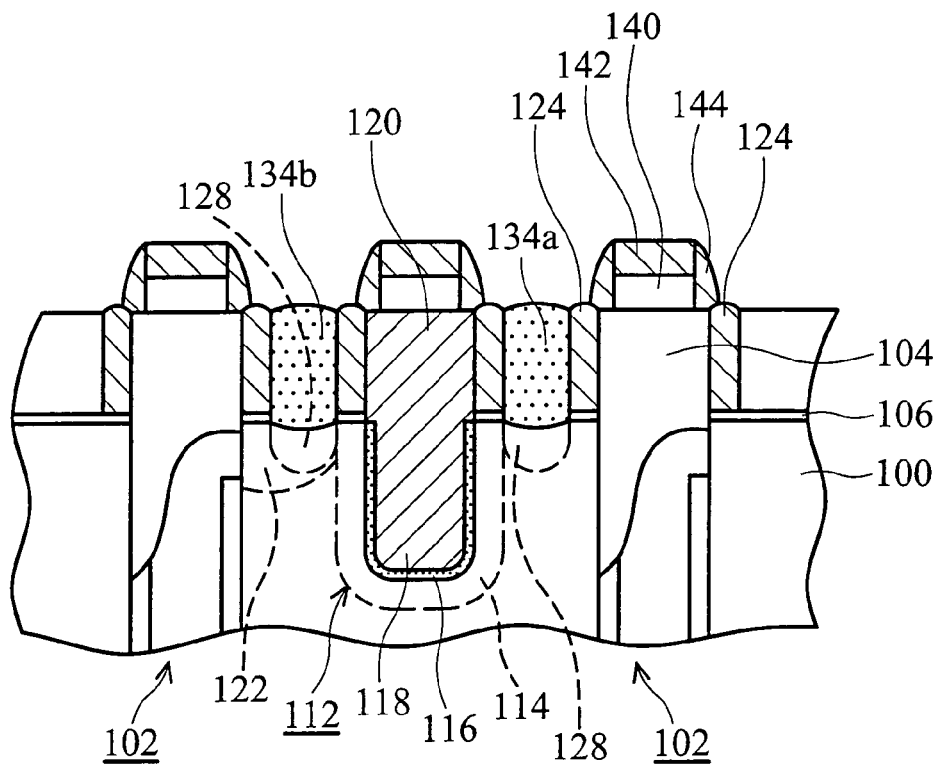
FIG. 10 is cross section view illustrating the method for forming word lines of an embodiment of the invention.

Referring to FIG. 10, spacers 144 are formed on the side walls of word lines 140 and gate cap dielectrics 142, preferably nitride, can be formed using a CVD process and a RIE etch back process. Preferably, the thickness of the nitride spacers 144 is 300 Å to 1000 Å.

Figure 11:
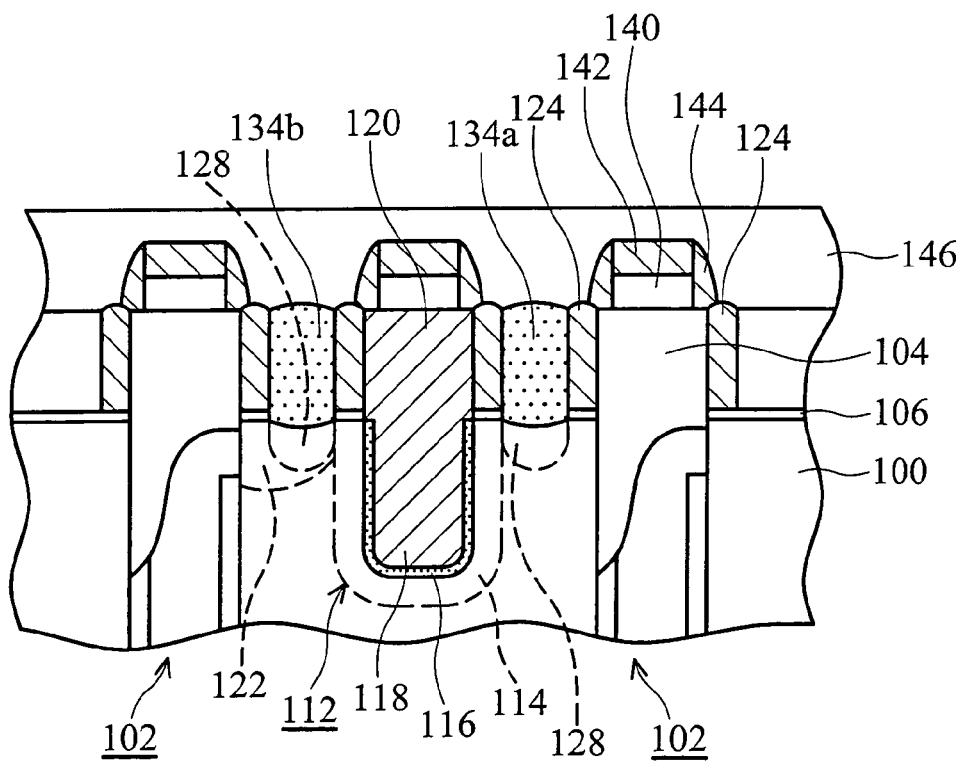
FIG. 11 is cross section view illustrating the method for forming bit line contacts of an embodiment of the invention.

Referring to FIG. 11, a second layer of dielectric material 146 is formed over the substrate. The second layer of dielectric material comprises BPSG deposited and reflowed following conventional processes.

Figure 12:
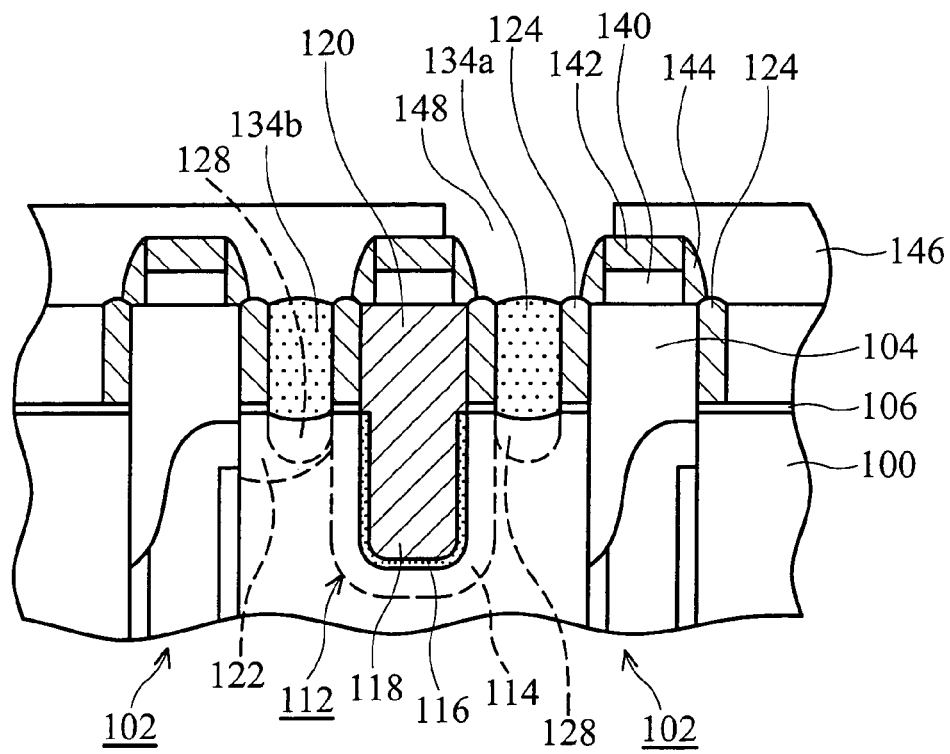
FIG. 12 is cross section view illustrating the method for forming bit line contacts of an embodiment of the invention.

Referring to FIG. 12, the second layer of dielectric material 146 is patterned by a photolithography process and an etching process to form bit line contact holes 148 on the buried bit line contacts 134a, exposing the buried bit line contacts 134a.

Figure 13:
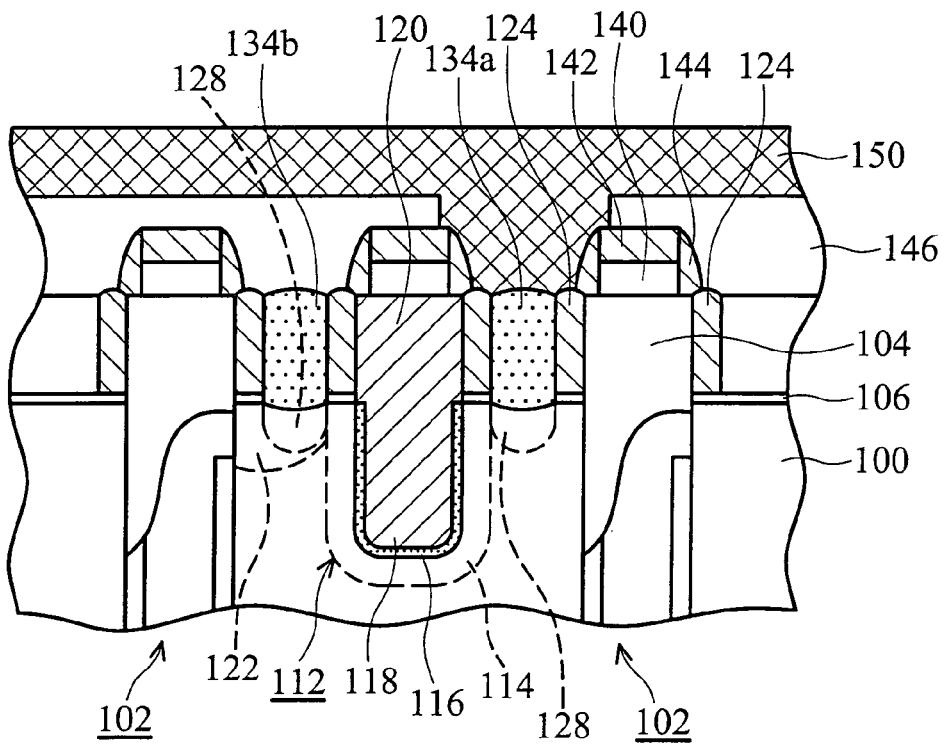
FIG. 13 is cross section view illustrating the method for forming bit line contacts of an embodiment of the invention.

Referring to FIG. 13, a second layer of metal material (which can also be called a second layer of conductive material) is formed on the second layer of dielectric material 146 and fills the bit line contact holes 148 to form upper bit line contacts. The second layer of metal material can comprise polysilicon, Ti, TiN, and tungsten (W). Consequently, the layer of metal material is patterned to form parallel bit lines 150 (eq., using a photolithography process and an etching process).

Alternatively (not show), bit lines and upper bit line contacts can be optically patterned by a conventional dual damascene process. The upper bit line contact hole 148 are formed by a selective self-aligned RIE to exposed the buried bit line contacts 134a and bit line trenches are formed by simple BPSG etching through. Metal liners (CVD or PVD Ti/TiN) and CVD tungsten (W) bit lines are then deposited and CMP polished to form dual damascene bit lines and upper bit line contacts.

When compared with the prior art, the word lines occupy a smaller space. The word line structures save space for bit line contacts and enlarge the window for forming upper bit line contacts. Another advantage of the word line structures is that they improve word line RC delay and also reduce the bit line and word line coupling.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor device, comprising:
    providing a substrate with recessed gates and deep trench capacitor devices therein, wherein protrusions of the recessed gates and upper portions of the deep trench capacitor devices are revealed;
    forming spacers on sidewalls of the upper portions and the protrusions;
    forming buried portions of conductive material in spaces between the spacers;
    patterning the substrate, the spacers and the buried portions to form parallel shallow trenches for defining active regions;
    forming a layer of dielectric material in the shallow trenches, wherein some of the buried portions serve as buried bit line contacts; and
    forming word lines across the recessed gates, wherein at least one of the word lines comprises portions overlapping the recessed gates, at least one of the overlapped portions having a narrower width than at least one of the recessed gates.

2. The method for forming a semiconductor device of claim 1, wherein the spacers comprise SiN.

3. The method for forming a semiconductor device of claim 1, wherein the conductive material comprises polysilicon.

4. The method for forming a semiconductor device of claim 1, wherein the spaces further surround the upper portions of the deep trench capacitor devices.

5. The method for forming a semiconductor device of claim 1, wherein the dielectric material comprises oxide.

6. The method for forming a semiconductor device of claim 1, wherein the patterning method comprises a photolithography process and an etching process.

7. The method for forming a semiconductor device of claim 1, wherein the parallel shallow trenches are formed adjacent to patterned edges of the deep trench capacitor devices and the recessed gates.

8. The method for forming a semiconductor device of claim 1, further comprising forming an upper bit line contact on one of the buried bit line contacts and a bit line connected to the upper bit line contact.

9. A method for forming a semiconductor device, comprising:
    providing a substrate with recessed gates and deep trench capacitor devices therein, wherein protrusions of the recessed gates and upper portions of the deep trench capacitor devices are revealed;
    forming spacers on sidewalls of the upper portions and the protrusions;
    forming a first layer of conductive material over the substrate;
    planarizing the first layer of conductive material to form buried portions in spaces between the spacers;
    patterning the substrate, the spacers, the buried portions, the deep trench capacitor devices and the recessed gates to form parallel shallow trenches for defining active regions;
    forming a first layer of dielectric material in the shallow trenches, wherein some of the buried portions serve as buried bit line contacts; and
    forming word lines across the recessed gates, wherein at least one of the word lines comprises portions overlapping the recessed gates, at least one of the overlapped portions having a narrower width than at least one of the recessed gates.

10. The method for forming a semiconductor device of claim 9, further comprises:
    forming a second layer of dielectric material over the substrate;
    etching the second layer of dielectric material to form a bit line contact hole on one of the buried bit line contacts;
    forming a second layer of conductive material on the second layer of dielectric material and filling the bit line contact hole to form an upper bit line contact; and
    patterning the second layer of conductive material to form a bit line connecting to the upper bit line contact.

11. The method for forming a semiconductor device of claim 10, wherein the second dielectric material comprises oxide.

12. The method for forming a semiconductor device of claim 10, wherein the second conductive material comprises polysilicon, Ti, TiN, and tungsten (W).

13. The method for forming a semiconductor device of claim 10, wherein patterning the second layer of conductive material comprises using a photolithography process and an etching process.

14. The method for forming a semiconductor device of claim 9, wherein the spacers comprise SiN.

15. The method for forming a semiconductor device of claim 9, wherein the first conductive material comprises polysilicon.

16. The method for forming a semiconductor device of claim 9, wherein the planarizing method comprises chemical mechanical polishing (CMP), blanket etching back or recess etching.

17. The method for forming a semiconductor device of claim 9, wherein the spaces further surround the upper portions of the deep trench capacitor devices.

18. The method for forming a semiconductor device of claim 9, wherein the first dielectric material comprises oxide.

19. The method for forming a semiconductor device of claim 9, wherein the patterning method comprises using a photolithography process and an etching process.

20. The method for forming a semiconductor device of claim 9, wherein the parallel shallow trenches are formed adjacent to patterned edges of the deep trench capacitor devices and the recessed gates.

21. A method for forming a semiconductor device, comprising:
providing a substrate with recessed gates and deep trench capacitor devices therein, wherein protrusions of the recessed gates and upper portions of the deep trench capacitor devices are revealed;
forming spacers on sidewalls of the upper portions and the protrusions;
forming a first layer of conductive material over the substrate;
planarizing the first layer of conductive material, the spacers, the deep trench capacitor devices and the recessed gates to form buried portions in spaces between the spacers, wherein the upper portions of the deep trench capacitor devices are surrounded by the buried portions;
patterning the substrate, the spacers, the buried portions, the deep trench capacitor devices and the recessed gates to form parallel shallow trenches for defining active regions;
forming a first layer of dielectric material in the shallow trenches, wherein some of the buried portions serve as buried bit line contacts; and
forming word lines across the recessed gates, wherein at least one of the word lines comprises portions overlapping the recessed gates, at least one of the overlapped portions having a narrower width than at least one of the recessed gates.

22. The method for forming a semiconductor device of claim 21, further comprises:
forming a second layer of dielectric material over the substrate;
patterning the second layer of dielectric material to form a bit line contact hole and a bit line trench communicating therewith; and
forming a second layer of conductive material in the bit line contact hole and the bit line trench.

23. The method for forming a semiconductor device of claim 22, wherein the second dielectric material comprises oxide.

24. The method for forming a semiconductor device of claim 22, wherein the second conductive material comprises polysilicon, Ti, TiN, and tungsten (W).

25. The method for forming a semiconductor device of claim 22, wherein patterning the second layer of conductive material comprises using of a photolithography process and an etching process.

26. The method for forming a semiconductor device of claim 21, wherein the spacers comprise SiN.

27. The method for forming a semiconductor device of claim 21, wherein the first conductive material comprises polysilicon.

28. The method for forming a semiconductor device of claim 21, wherein the planarizing method comprises chemical mechanical polishing (CMP), blanket etching back or recess etching.

29. The method for forming a semiconductor device of claim 21, wherein the spaces further surround the upper portions of the deep trench capacitor devices.

30. The method for forming a semiconductor device of claim 21, wherein the first dielectric material comprises oxide.

31. The method for forming a semiconductor device of claim 21, wherein the patterning method comprises using a photolithography process and an etching process.

32. The method for forming a semiconductor device of claim 21, wherein the parallel shallow trenches are formed adjacent to patterned edges of the deep trench capacitor devices and the recessed gates.

* * * * *